(12) United States Patent
Tousi et al.

(10) Patent No.: US 10,680,553 B2
(45) Date of Patent: Jun. 9, 2020

(54) SCALABLE TERAHERTZ PHASED ARRAY AND METHOD

(71) Applicant: Cornell University, Ithaca, NY (US)

(72) Inventors: Yahya Tousi, San Jose, CA (US); Ehsan Afshari, Ithaca, NY (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 15/117,060

(22) PCT Filed: Feb. 9, 2015

(86) PCT No.: PCT/US2015/014993
§ 371 (c)(1),
(2) Date: Aug. 5, 2016

(87) PCT Pub. No.: WO2015/120374
PCT Pub. Date: Aug. 13, 2015

(65) Prior Publication Data
US 2017/0170785 A1     Jun. 15, 2017

Related U.S. Application Data

(60) Provisional application No. 61/937,301, filed on Feb. 7, 2014.

(51) Int. Cl.
*H03B 5/24*     (2006.01)
*H01Q 21/00*     (2006.01)
(Continued)

(52) U.S. Cl.
CPC .............. *H03B 5/24* (2013.01); *H01Q 3/36* (2013.01); *H01Q 9/0407* (2013.01);
(Continued)

(58) Field of Classification Search
CPC .... H01Q 3/34; H01Q 21/0025; H01Q 21/245; H01Q 9/0407; H01Q 3/36;
(Continued)

(56) References Cited

U.S. PATENT DOCUMENTS 5,680,141 A     10/1997     DiDomenico et al.
5,990,761 A     11/1999     Hamparian et al.
(Continued)

OTHER PUBLICATIONS

Pogorzelski, R.J., Coupled Oscillator Based Agile Beam Transmitters and Receivers: A Review of Work at JPL, Mar. 4, 2006. http://trs-new.jpl.nasa.gov/dspace/bitstream/2014/41209/01/05-3002.pdf.

*Primary Examiner* — Arnold M Kinkead
(74) *Attorney, Agent, or Firm* — Hodgson Russ LLP

(57) ABSTRACT

A device and method for terahertz signal generation are disclosed. Oscillators are arranged in a two-dimensional array, each oscillator connected to a corresponding antenna. Each oscillator is unidirectional connected to its adjacent oscillators by a phase shifter. A method for generating a steerable terahertz signal utilizes an array of oscillators connected by corresponding phase shifters. A terahertz signal having a fundamental frequency is generated using the array. The phase shift of one or more of the phase shifters is varied in order to vary the fundamental frequency and/or steer the signal generated by the array.

20 Claims, 7 Drawing Sheets

(51) Int. Cl.
  *H01Q 21/24* (2006.01)
  *H01Q 9/04* (2006.01)
  *H03B 5/12* (2006.01)
  *H04L 12/933* (2013.01)
  *H04L 27/20* (2006.01)
  *H01Q 3/36* (2006.01)

(52) U.S. Cl.
  CPC ....... *H01Q 21/0025* (2013.01); *H01Q 21/245* (2013.01); *H03B 5/1212* (2013.01); *H04L 27/20* (2013.01); *H04L 49/101* (2013.01); *H03B 2200/0084* (2013.01)

(58) Field of Classification Search
  CPC  H03B 2200/0084; H03B 5/24; H03B 5/1212; H04L 49/101; H04L 27/20
  USPC ....... 342/372, 368; 331/2, 46, 135; 343/909, 343/705, 753
  See application file for complete search history.

(56) References Cited

U.S. PATENT DOCUMENTS

| | | | |
|---|---|---|---|
| 8,797,105 B2* | 8/2014 | Afshari | .................. H03B 28/00 331/135 |
| 2008/0297414 A1 | 12/2008 | Krishnaswamy et al. | |
| 2012/0274410 A1 | 11/2012 | Koyama | |
| 2013/0082785 A1 | 4/2013 | Afshari et al. | |
| 2014/0097986 A1* | 4/2014 | Xue | ........................ H01Q 3/34 342/372 |

* cited by examiner

| Ref. | This Work | [1] | [2] | [3] | [4] |
|---|---|---|---|---|---|
| Frequency (GHz) | 338 | 290 | 260 | 280 | 288 |
| Total Power (dBm) | -0.9 | -1.2 | 0.5[tt] | -7.2[ttt] | -4.1[tt] |
| Peak EIRP (dBm) | 17.1 | N/A[t] | 15.7 | 9.4 | N/A |
| Frequency Tuning (%) | 2.1 | 4.5 | 1.4 | 3.2 | Non-tuning |
| Phase Noise (dBc/Hz) (@ 1MHz offset) | -93 | -78 | -78.3 | N/A | -87 |
| Beam Steering (degree of each angle) | 45/50 | N/A | Fixed | 80/80 | Fixed |
| DC Power (W) | 1.54[tttt] | 0.33 | 0.8 | 0.81 | 0.28 |
| Technology | 65nm bulk CMOS | 65nm bulk CMOS | 65nm bulk CMOS | 45nm SOI CMOS | 65nm bulk CMOS |
| Area (mm$^2$) | 3.9 | 0.36 | 2.25 | 7.2 | 0.32 |

[t] Power measured by probing.
[tt] A Hemispheric lens is used for back-side radiation.
[ttt] Substrate-thinning used for front-side radiation.
[tttt] 1.3W for radiators and 240mW for couplings.

Fig. 7

SCALABLE TERAHERTZ PHASED ARRAY AND METHOD

CROSS-REFERENCE TO RELATED APPLICATIONS

This application claims priority to U.S. Provisional Application No. 61/937,301, filed on Feb. 7, 2014, the disclosure of which is incorporated herein by reference.

STATEMENT REGARDING FEDERALLY SPONSORED RESEARCH

This invention was made with government support under contract no. ECCS-0954537 awarded by the National Science Foundation. The government has certain rights in the invention.

FIELD OF THE DISCLOSURE

The present disclosure relates to terahertz signal generation, and more particularly to phased-arrays for terahertz signal generation.

BACKGROUND OF THE DISCLOSURE

There is an untapped market for integrated high-resolution imaging and spectroscopy at mm-wave and THz frequencies (for example, 300 GHz-3 THz). Some approaches have been recently proposed to render on-chip signal generation and transmission at these frequencies. However, as the frequency approaches the physical limitations of such devices, self-sustained oscillation becomes increasingly difficult and the generated power fades away.

In traditional phased arrays, as the number of rows and columns increases, the complexity of array connections and phase shifters becomes a major obstacle. This challenge is even more detrimental at mm-Wave and THz frequencies where conductive loss, undesired couplings, phase/gain mismatch, and high power consumption are among many adverse effects of such lengthy connections.

BRIEF SUMMARY OF THE DISCLOSURE

The present disclosure provides a scalable phased array for signal generation and methods for terahertz signal generation. In the disclosed device, multiple radiators are coupled locally without any global connection. Furthermore, the disclosure provides techniques for controlling the phase and frequency of the sources resulting in independent frequency control and beam forming. An exemplary device was produced according to an embodiment of the disclosure and demonstrated the highest measured radiated terahertz power on silicon.

Utilizing the presently disclosed techniques, the limited power from individual signal generators can be offset by coherent power-combining of multiple sources, providing a desirable mechanism to generate high power levels above the $f_{max}$ which: (1) enables a scalable approach to generate and combine the maximum available power from individual sources; and (2) provides controllable phase shift between multiple sources in order to provide beam steering at any desired direction.

A device is disclosed for terahertz signal generation, the device comprising a plurality of oscillators arranged in a two-dimensional array. Each oscillator has an input, an antenna line, and an output, and each oscillator has a fundamental frequency that is substantially the same as the other oscillators of the array. A plurality of antennae, wherein each antenna is connected to the antenna line of a corresponding oscillator of the plurality of oscillators. A plurality of unidirectional phase shifters, each phase shifter connected between adjacent oscillators from the output of an oscillator to the input of an adjacent oscillator. Each oscillator is connected to each adjacent oscillator in the array by at least one phase shifter, the input of each oscillator being connected to an equivalent number of phase shifters as the corresponding output, and the input of each oscillator being connected to an equivalent number of phase shifters as each input of the other oscillators of the plurality of oscillators.

In another aspect, a method for generating a steerable terahertz signal is disclosed. The method comprises providing an array of oscillators, each oscillator connected to an antenna. Each oscillator is unidirectionally connected to each adjacent oscillator of the array through phase shifters. A terahertz signal having a fundamental frequency is generated using the array. The phase shift of one or more of the phase shifters is varied in order to vary the fundamental frequency and/or steer the signal generated by the array.

DESCRIPTION OF THE DRAWINGS

For a fuller understanding of the nature and objects of the disclosure, reference should be made to the following detailed description taken in conjunction with the accompanying drawings, in which:

FIG. 7 shows a chart comparing performance of an apparatus according to the present disclosure as compared with alternative techniques (where columns labeled [1]-[4] represent previous technologies, † indicates power measured by probing, †† indicates a hemispheric lens used for back-side radiation, ††† indicates substrate thinning used for front-side radiation, and †††† indicates 1.3 W for radiators and 240 mW for couplings)

DETAILED DESCRIPTION OF THE DISCLOSURE

Figure 1:
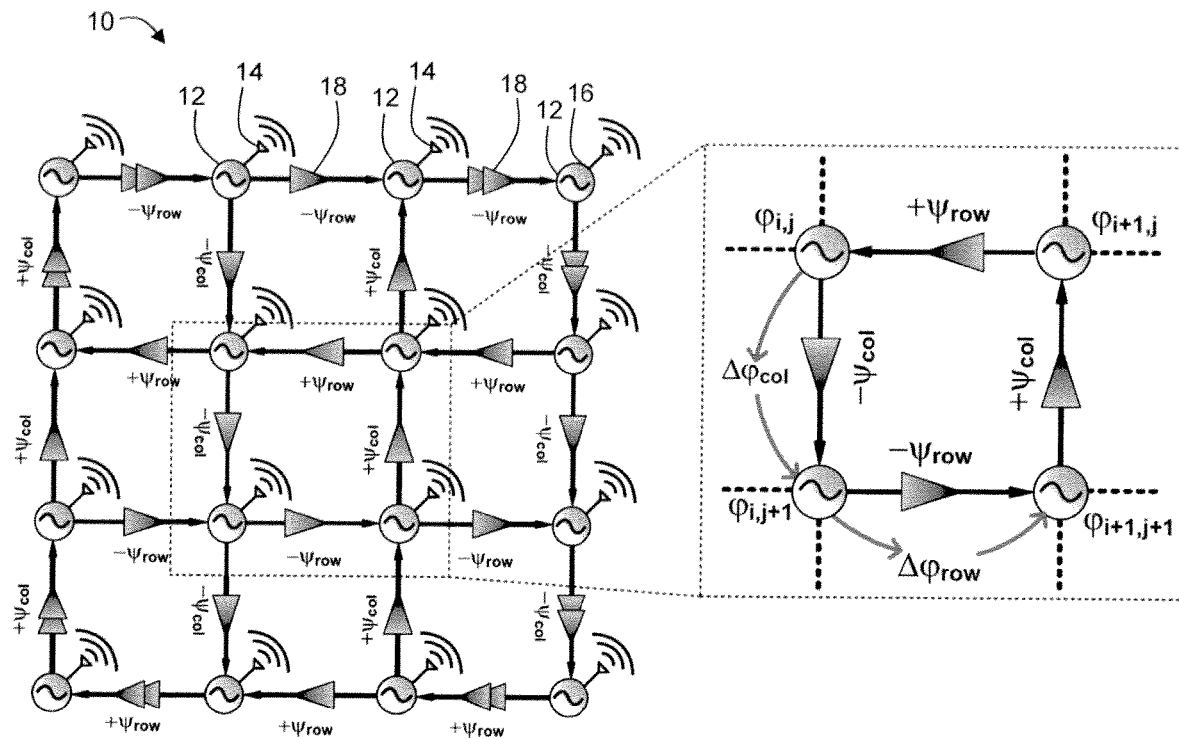
FIG. 1 depicts a four-by-four THz phased array based on locally coupled oscillators, and an inset showing additional detail regarding the array.
Figure 2:
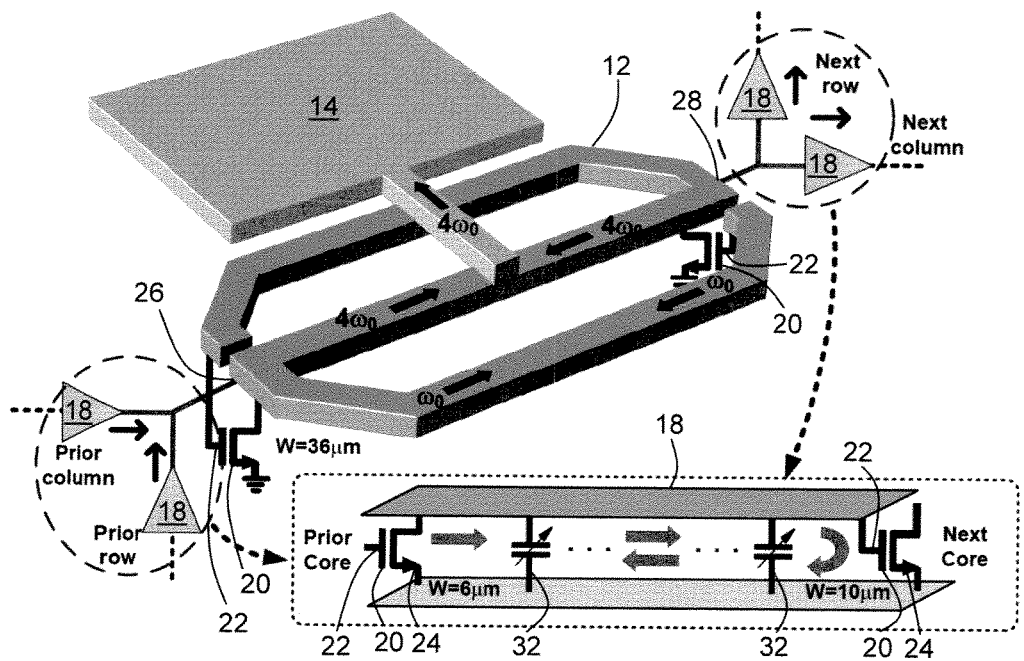
FIG. 2 depicts an oscillator and interconnecting phase shifters according to an embodiment of the present disclosure.
Figure 3A:
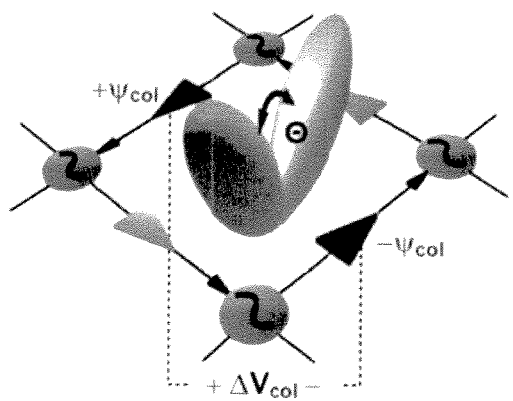
FIGS. 3A-3D show the concept of beam steering in a coupled loop, and the measured beam steering in the four-by-four structure.
Figure 3B:
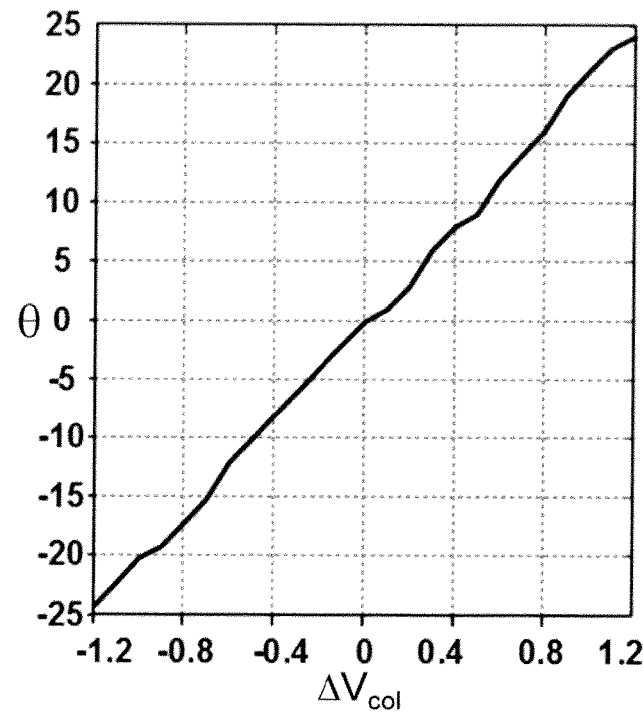
Figure 3C:
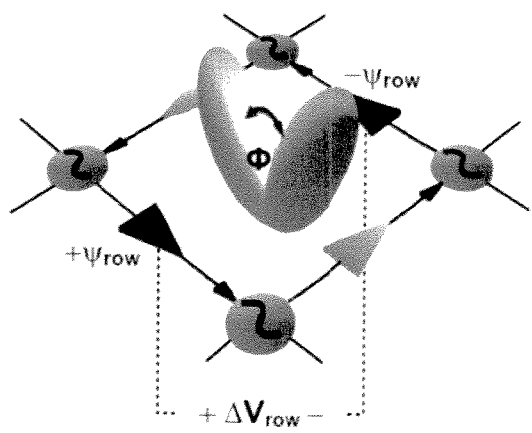
Figure 3D:
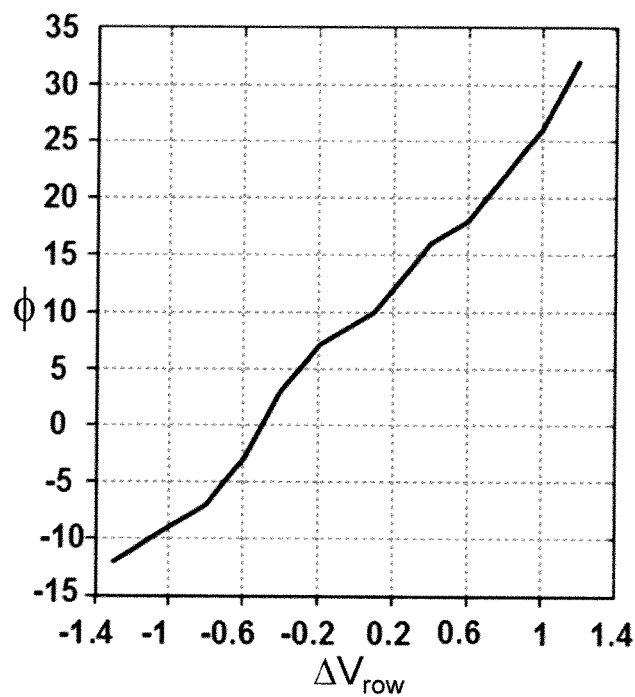

With reference to FIGS. 1-2, the present disclosure may be embodied as a scalable device 10 for terahertz ("THz") signal generation and radiation. The device 10 comprises a plurality of oscillators 12 arranged in a two-dimensional array. The array of oscillators 12 will be described in terms of rows and columns, although it should be noted that such reference is for convenience only and is not intended to be limiting. Each oscillator 12 has an output 28, an input 26, and an antenna line. Each oscillator 12 is electrically connected to a corresponding antenna 14. As such, a plurality of antennae 14 is provided whereby each antenna 14 is connected to the antenna line of a corresponding oscillator 12 of the array. Each oscillator 12 and antenna 14 form a THz radiator 16. The radiators 16 are configured to radiate independently of each other. Each oscillator 12 has an oscillating frequency that is substantially the same as the oscillating frequencies of the other oscillators 12. In some embodiments, substantially the same oscillating frequency means that the oscillating frequencies of the oscillators 12 of the array can be locked to a fundamental frequency when the oscillators 12 are coupled as described below. In other embodiments, substantially the same means the oscillating frequencies vary from each other by a value selected from 1%-5%.

Each oscillator 12 is unidirectionally coupled to its adjacent oscillators 12 by way of variable phase shifters 18 (also referred to herein as "coupling blocks"). The device 10 comprises a plurality of unidirectional phase shifters 18, each phase shifter 18 connected between adjacent oscillators 12 of the plurality of oscillators from the output of an oscillator to the input of an adjacent oscillator 12. As such, phase shifters 18 are provided between each oscillator 12 in the row direction ($\Psi_{row}$) and between each oscillator 12 in the column direction ($\Psi_{col}$). Such a network is inherently scalable because it only relies on oscillator 12 couplings with nearest neighbors and there is no high-frequency global routing to any oscillator 12. The purpose of this topology is twofold: first, to synchronize all the oscillators 12 to a single frequency (fundamental frequency $\omega_0$); and next, to set a desired phase shift between the adjacent elements ($\Delta\varphi_{row}$ and $\Delta\varphi_{col}$). By employing such a coupling structure, only a small subset of all the theoretical coupling modes are physically stable. By proper control of the couplings, one can ensure the system settles into the desired coupling mode.

The propagation direction of each of the unidirectional phase shifters 18 in each row is the same as the propagation direction of the other phase shifters 18 in the respective row. The propagation direction of the phase shifter 18 rows alternates in the successive rows of the array. Similarly, the propagation direction of each of the unidirectional phase shifters 18 in each column is the same as the propagation direction of the other phase shifters 18 in the respective column, and the propagation direction of the phase shifter 18 columns alternates in the successive columns of the array.

To provide a symmetric array, it is desirable that the injected energy into each oscillator 12 and the output load for each oscillator 12 be the same among the oscillators 12. This is achieved by doubling the magnitude of coupling blocks 18 on the edges of the array. Such magnitude doubling can be done by placing two coupling blocks 18 in parallel as shown in FIG. 1. As such, each oscillator 12 can be configured such that its output is connected to an equivalent number of phase shifters 18 as the outputs of the other oscillators 12 of the array (i.e., each oscillator 12 of the array has an equivalent number of phase shifters 18 attached at the output). Similarly, each oscillator 12 can be configured such that its input is connected to an equivalent number of phase shifters 18 as the inputs of the other oscillators 12 of the array (i.e., each oscillator 12 of the array has an equivalent number of phase shifters 18 attached at the input). It should be noted that an oscillator may be connected to an equivalent number of phase shifters by being connected to the same number of phase shifters, or the oscillator may be connected to a different number of phase shifters that are configured to provide an equivalent injected signal (or output load, as the case may be). In this way, while the oscillators 12 are located in different parts of the lattice, they are all subject to the same frequency and phase shift dynamics. The dimensions of the array may have an even number of elements. The number of elements along a first dimension of the array can be the same or different than the number of elements along a second dimension of the array.

In this coupled network, the phase and frequency of each element of the array are related to their neighboring elements through a two-dimensional version of Adler's equation:

$$\omega = \omega_0 + K\sin(\Delta\varphi_{col} \pm \Psi_{col}) + K\sin(\Delta\varphi_{row} \pm \Omega_{row}) \qquad (1)$$

Based on this equation, two scenarios are conceivable. First, if all coupling phases ($\Psi_{row}$ and $\Psi_{col}$) are equally changed, the locking frequencies of oscillators 12 change while their respective phases, $\varphi_{i,j}$, remain the same. This dynamic is similar to the delay-coupled oscillators introduced in Y. M. Tousi, O. Momeni, and E. Afshari, "A Novel CMOS High-power THz VCO Based on Coupled Oscillators: Theory and Implementation," *IEEE J. Solid-State Circuits*, vol. 47, pp. 3032-3042, December 2012, incorporated herein by this reference. For example, if all coupling phases increase by the same amount, the frequency of all oscillators 12 decreases to keep the phase difference between oscillators 12 constant. On the other hand, by changing the coupling phase shifts in a differential manner (for example, changing, the coupling phase shifts for a row of phase shifters), the relative phase of adjacent oscillators changes while the frequency remains constant (see FIGS. 3A-3D). A differential control of the row and column phase shifters 18 changes the phase shift of the columns and rows of the network, respectively. Since these differential phase shifts are independent, by combining them it is possible to simultaneously control the phase difference of adjacent rows and columns of the coupled system. This enables a radiated beam to steer in both polar directions. Hence, by changing the phase shifts together or differentially, the frequency and the direction of the radiated beam can be independently controlled.

With reference to FIG. 2, each oscillator 12 may be a cross-coupled pair of transistors that delivers its output power to a matched antenna 14. The antenna 14 may be designed at a harmonic of the fundamental frequency ($\omega_0$), for example, the antenna 14 may be tuned to the fourth harmonic ($4\omega_0$). As shown in FIG. 2, the lines connecting the gates 22 and sources 24 of the core devices 20 and the output load compose a distributed multi-port circuit. At the fundamental frequency, this network can be optimized to maximize the voltage swing and the outgoing coupled energy. In an exemplary embodiment, at the fourth harmonic, the network may be designed to deliver the maximum available harmonic power to the antenna 14.

In an exemplary embodiment, the coupling phase shifters 18 inject energy at the fundamental frequency from each given oscillator 12 to two of its four neighbors (i.e., adjacent oscillators 12). The other two adjacent nodes inject energy into that oscillator 12. A distributed phase shifter 18 may be implemented (see FIG. 2) in order to effectively absorb the half-wavelength separation between adjacent oscillators 12. This embodiment of phase shifter 18 includes an artificial transmission line that is only impedance-matched at the input side, resulting in a distributed resonator. The phase shift of the resonator is tunable using a plurality of varactors 32 along the transmission line. To maximize the tuning capability of the phase shifters 18, the center frequency of the resonator may be designed to match the fundamental frequency ($\omega_0$) of the core oscillators 12.

Effective radiation is another aspect of the disclosed THz signal source. Integrated sources at mm-wave and THz frequencies have typically used dipole-based antennas, which are double-sided radiators. As the frequency of operation approaches the THz band, substrate thickness becomes comparable to the wavelength, guiding most of the energy into lossy substrate modes. Either a matched silicon lens or extra wafer thinning is required to cancel these undesired modes. Devices 10 of the present disclosure eliminate the need for such extra components and post-processing by using a patch antenna 14 with broad-side radiation only from the top of the chip. However, at a target frequency of, for example, 340 GHz, the largest distance between two metal layers is still considerably smaller than the wavelength. As a result, the radiation bandwidth of the antenna 14 is limited and the antenna 14 should be sized accordingly. In order to improve the radiation efficiency, the antenna 14 central frequency may be designed to match the center frequency of the oscillators 12.

Figure 4:
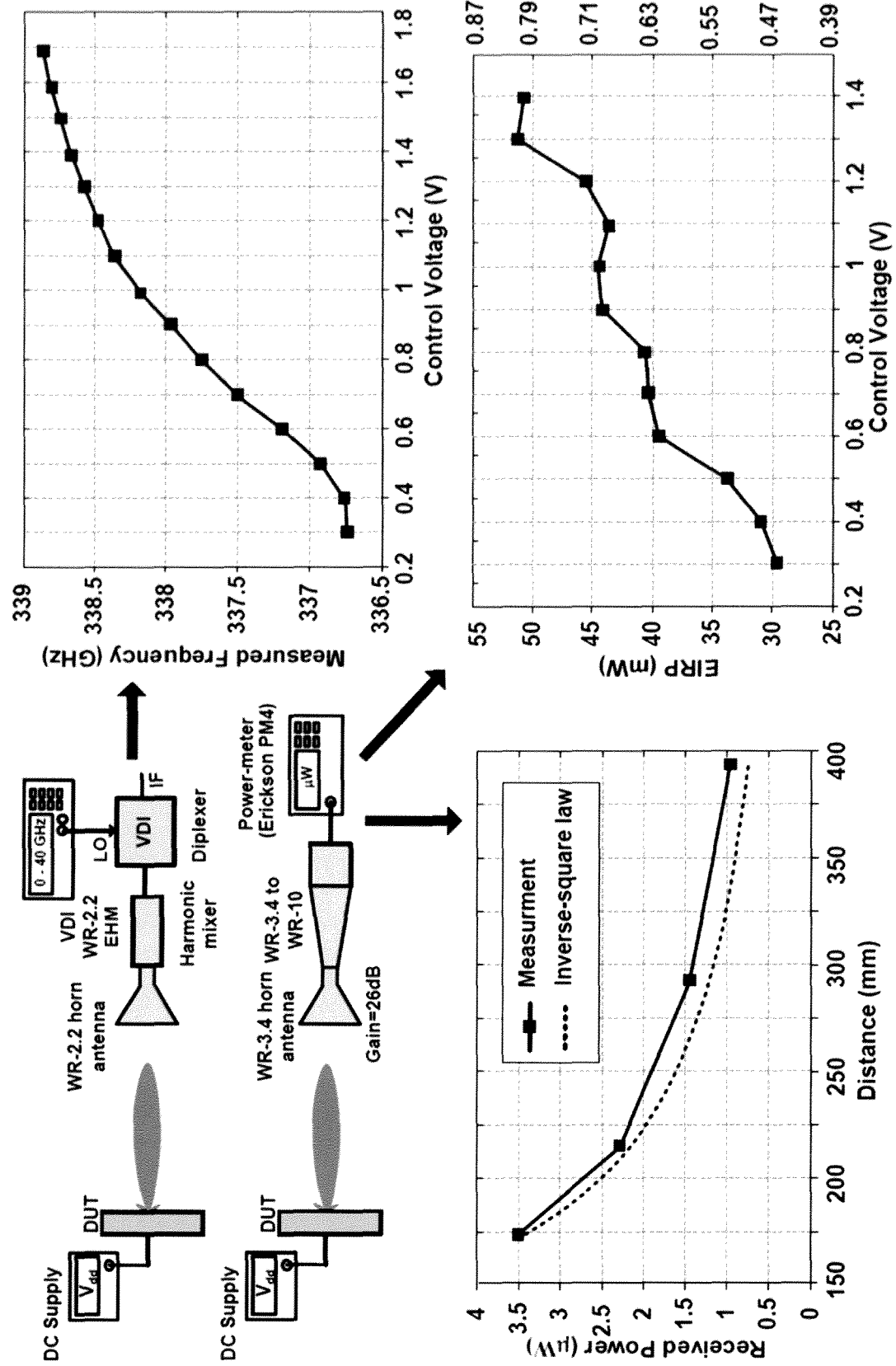
FIG. 4 depicts a chip measurement setup and the measured output power and frequency.
Figure 5:
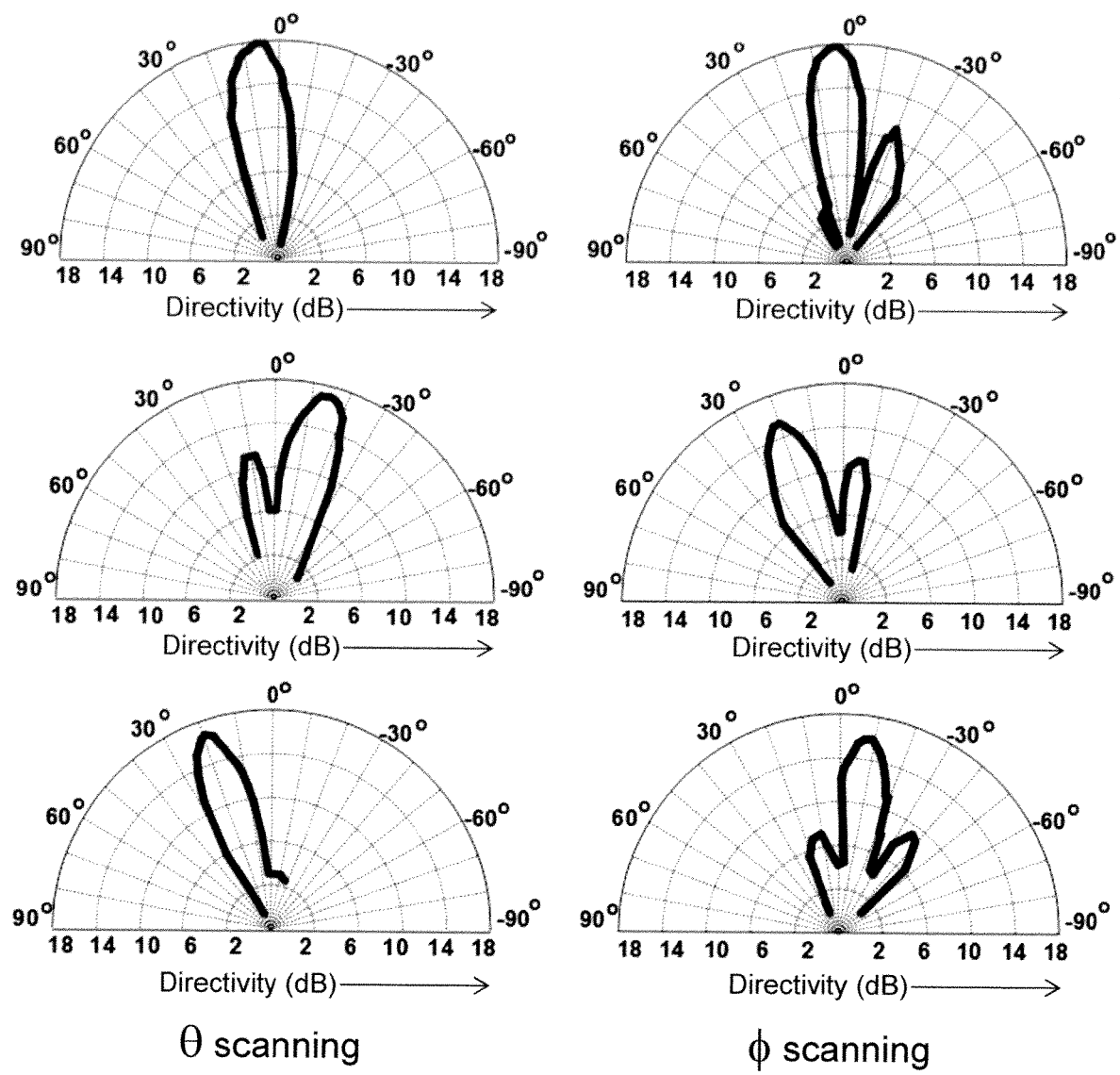
FIG. 5 shows measured beam patterns and directivity at different steering angles.
Figure 6:
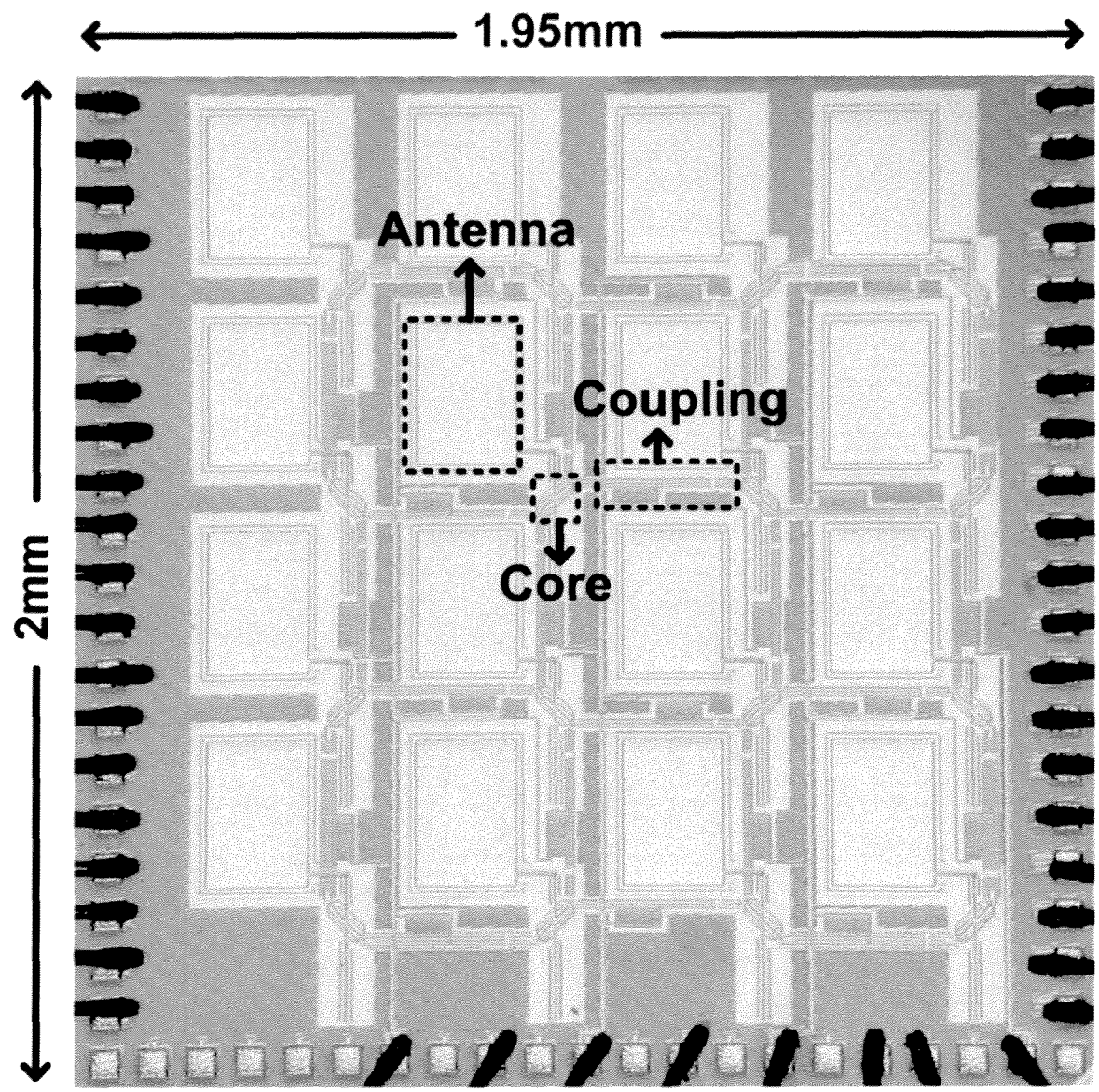
FIG. 6 is a chip micrograph of a device according to the present disclosure.

An exemplary device, shown in FIG. 6, was fabricated in a TSMC 65 nm bulk CMOS process. The device comprised of a 4×4 phased array, including integrated antennas. As shown in FIG. 4, the radiated frequency spectrum was measured using a WR2.2 horn antenna connected to a VDI WR-2.2EHM harmonic mixer. The 12th harmonic of the local oscillator ("LO") was mixed with the received signal and downconverted into the IF band. The measured central frequency of the oscillator was 338 GHz and the measured phase noise was −93 dBc/Hz at 1 MHz offset frequency. The low phase noise was a direct result of the topology of the system that couples multiple sources. Adjusting the coupling phase shifters provided 2 GHz of frequency tuning. The frequency tuning range could be increased to 7 GHz (333 GHz to 340 GHz) by changing the supply voltage by ±10%. To measure the radiation patterns shown in FIG. 5, the VDI WR2.2-ZBD detector was used and the chip was rotated in both angles with respect to the detector. The measurements confirm that the differential control of the phase shifters was able to keep the frequency constant while steering the radiated beam across the 2-D angles. The measured beam-steering was 45 degrees along the φ axis and 50 degrees along the θ axis as shown in FIGS. 3A-3D. By utilizing multiple active stages, the injected energy from the phase shifters can be increased, thereby achieving a wider tuning range or beam steering. An Ericson PM4 power detector was used to measure radiated power. As shown in FIG. 4, the radiated power was measured both as a function of the control voltage in a fixed distance to the antenna, and as a function of distance for a fixed control voltage. The measured peak EIRP of the chip was +17.1 dBm at 338 GHz. By reducing the antenna gain derived from the measured beam pattern, the peak total radiated power from the chip was 0.8 mW. FIG. 7 compares the performance of the circuit with alternative techniques. The presently disclosed lensless source demonstrated the highest radiated power and EIRP as well as the lowest phase noise among the CMOS arrays above 200 GHz shown in the Table. Moreover, the presently disclosed technique provides an effective way to realize a scalable THz phased array with independent frequency control and beam steering.

Figure 8:
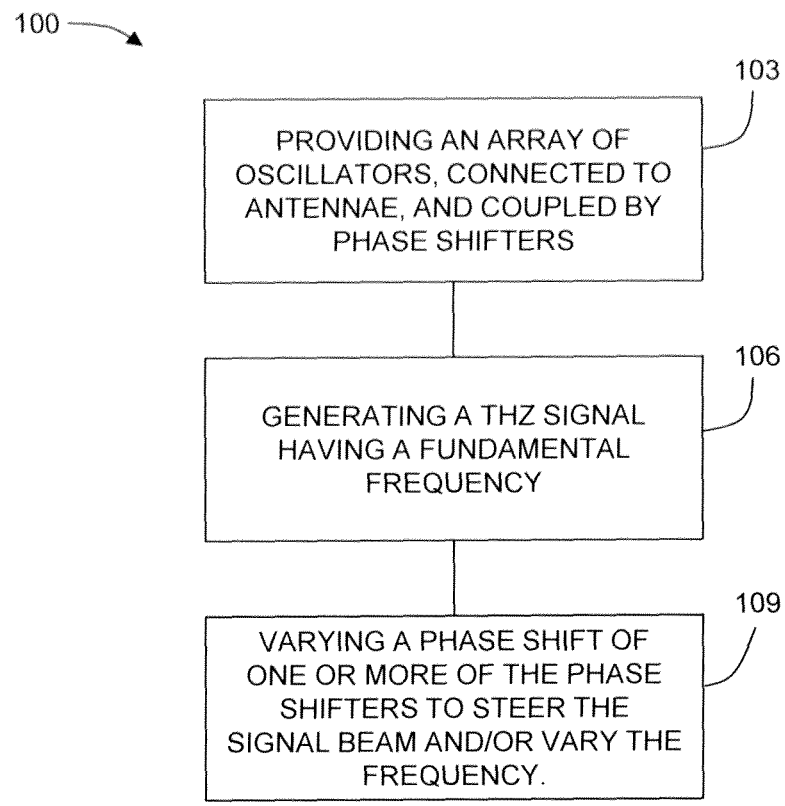
FIG. 8 is a chart depicting a method according to another embodiment of the present disclosure.

The present disclosure may be embodied as a method 100 for generating a steerable terahertz signal (see, e.g., FIG. 8). The method 100 comprises the step of providing an array of oscillators. The array of oscillators can be any of the embodiments disclosed above. Each of the provided 103 oscillators is connected to an antenna, and each oscillator is unidirectionally connected to each adjacent oscillator of the array through corresponding phase shifters. The array is used to generate 106 a terahertz signal having a fundamental frequency. It should be noted that, as described above, the fundamental frequency need not be within the terahertz range, but the generated 106 terahertz signal may be a harmonic with a fundamental frequency below the terahertz range. The oscillators are coupled by way of the phase shifters. In some embodiments, generating 106 a terahertz signal may include the step of providing a phase shift in each of the phase shifters in order to lock each oscillator to the fundamental frequency.

The method 100 comprises varying 109 a phase shift of one or more of the phase shifters to vary the fundamental frequency and/or steer the signal generated by the array. In the case where the phase shift of the phase shifters is equally varied, the fundamental frequency of the generated 106 signal is varied. In the case where the phase shifts of at least a subset of the phase shifters is differentially varied, the signal is steered. As such, the fundamental frequency of the signal and/or the direction of the signal may be selectively varied.

Although the present disclosure has been described with respect to one or more particular embodiments, it will be understood that other embodiments of the present disclosure may be made without departing from the spirit and scope of the present disclosure. Hence, the present disclosure is deemed limited only by the appended claims and the reasonable interpretation thereof.

What is claimed is:
1. A device for terahertz signal generation, comprising:
    a plurality of oscillators arranged in a two-dimensional array, each oscillator having an input, an antenna line, and an output, and wherein each oscillator has a fundamental frequency that is substantially the same as the other oscillators;
    a plurality of antennae, each antenna being connected to the antenna line of a corresponding oscillator of the plurality of oscillators;
    a plurality of unidirectional phase shifters, each phase shifter connected between adjacent oscillators of the plurality of oscillators from the output of an oscillator to the input of an adjacent oscillator;
    wherein each oscillator is connected to each adjacent oscillator in the array by at least one phase shifter, the input of each oscillator being connected to an equivalent number of phase shifters as the corresponding output, and the input of each oscillator being connected to an equivalent number of phase shifters as each input of the other oscillators of the plurality of oscillators;
    wherein each oscillator is a cross-coupled pair of transistors;
    wherein at least one dimension of the two-dimensional array of oscillators includes at least three oscillators; and
    wherein each phase-shifter comprises a plurality of varactors configured to vary the phase shift according to a varying capacitance of the varactors.
2. The device of claim 1, wherein the cross coupled pair includes a first transistor and a second transistor, and wherein:
    a first transmission line connects a gate of the first transistor to a drain of the second transistor;
    a second transmission line connects a gate of the second transistor to a drain; and
    a third transmission line connects the drain of the first transistor to the drain of the second transistor.

3. The device of claim 1, wherein each phase shifter comprises a transmission line having a first end connected to the output of an oscillator and a second end connected to the input of an oscillator, and wherein the first end is impedance-matched to the connected oscillator.

4. The device of claim 1, wherein the phase-shifter is a resonator.

5. The device of claim 4, wherein a center frequency of the resonator is tuned to the fundamental frequency of the oscillators.

6. The device of claim 1, wherein the phase shifters are tuned to maximize a voltage swing and an outgoing coupled energy.

7. The device of claim 1, wherein each antenna is tuned to a fourth harmonic of the fundamental frequency.

8. The device of claim 1, wherein each antenna is a patch antenna.

9. A device for terahertz signal generation, comprising:
a plurality of oscillators arranged in a two-dimensional array, each oscillator having an input, an antenna line, and an output, and wherein each oscillator has a fundamental frequency that is substantially the same as the other oscillators;
a plurality of antennae, each antenna being connected to the antenna line of a corresponding oscillator of the plurality of oscillators;
a plurality of unidirectional phase shifters, each phase shifter connected between adjacent oscillators of the plurality of oscillators from the output of an oscillator to the input of an adjacent oscillator;
wherein each oscillator is connected to each adjacent oscillator in the array by at least one phase shifter, the input of each oscillator being connected to an equivalent number of phase shifters as the corresponding output, and the input of each oscillator being connected to an equivalent number of phase shifters as each input of the other oscillators of the plurality of oscillators; and
wherein each oscillator is a cross-coupled pair of transistors, and wherein each phase shifter comprises a transmission line having a first end connected to the output of an oscillator and a second end connected to the input of an oscillator, and wherein the first end is impedance-matched to the connected oscillator.

10. The device of claim 9, wherein the cross coupled pair includes a first transistor and a second transistor, and wherein:
a first transmission line connects a gate of the first transistor to a drain of the second transistor;
a second transmission line connects a gate of the second transistor to a drain; and
a third transmission line connects the drain of the first transistor to the drain of the second transistor.

11. The device of claim 9, wherein the phase shifters are tuned to maximize a voltage swing and an outgoing coupled energy.

12. The device of claim 9, wherein each antenna is tuned to a fourth harmonic of the fundamental frequency.

13. The device of claim 9, wherein each antenna is a patch antenna.

14. A device for terahertz signal generation, comprising:
a plurality of oscillators arranged in a two-dimensional array, each oscillator having an input, an antenna line, and an output, and wherein each oscillator has a fundamental frequency that is substantially the same as the other oscillators;
a plurality of antennae, each antenna being connected to the antenna line of a corresponding oscillator of the plurality of oscillators;
a plurality of unidirectional phase shifters, each phase shifter connected between adjacent oscillators of the plurality of oscillators from the output of an oscillator to the input of an adjacent oscillator;
wherein each oscillator is connected to each adjacent oscillator in the array by at least one phase shifter, the input of each oscillator being connected to an equivalent number of phase shifters as the corresponding output, and the input of each oscillator being connected to an equivalent number of phase shifters as each input of the other oscillators of the plurality of oscillators;
wherein each oscillator is a cross-coupled pair of transistors;
wherein at least one dimension of the two-dimensional array of oscillators includes at least three oscillators; and
wherein the phase-shifter is a resonator.

15. The device of claim 14, wherein the cross coupled pair includes a first transistor and a second transistor, and wherein:
a first transmission line connects a gate of the first transistor to a drain of the second transistor;
a second transmission line connects a gate of the second transistor to a drain; and
a third transmission line connects the drain of the first transistor to the drain of the second transistor.

16. The device of claim 14, wherein each phase shifter comprises a transmission line having a first end connected to the output of an oscillator and a second end connected to the input of an oscillator, and wherein the first end is impedance-matched to the connected oscillator.

17. The device of claim 14, wherein a center frequency of the resonator is tuned to the fundamental frequency of the oscillators.

18. The device of claim 14, wherein the phase shifters are tuned to maximize a voltage swing and an outgoing coupled energy.

19. The device of claim 14, wherein each antenna is tuned to a fourth harmonic of the fundamental frequency.

20. The device of claim 14, wherein each antenna is a patch antenna.

* * * * *